United States Patent
Sawada et al.

(10) Patent No.: US 9,461,240 B2
(45) Date of Patent: Oct. 4, 2016

(54) MAGNETORESISTIVE MEMORY DEVICE

(71) Applicants: Kazuya Sawada, Seoul (KR); Toshihiko Nagase, Seoul (KR); Youngmin Eeh, Seoul (KR); Koji Ueda, Seoul (KR); Daisuke Watanabe, Seoul (KR); Makoto Nagamine, Seoul (KR)

(72) Inventors: Kazuya Sawada, Seoul (KR); Toshihiko Nagase, Seoul (KR); Youngmin Eeh, Seoul (KR); Koji Ueda, Seoul (KR); Daisuke Watanabe, Seoul (KR); Makoto Nagamine, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/814,158

(22) Filed: Jul. 30, 2015

(65) Prior Publication Data

US 2016/0254442 A1 Sep. 1, 2016

Related U.S. Application Data

(60) Provisional application No. 62/121,337, filed on Feb. 26, 2015.

(51) Int. Cl.
*H01L 43/08* (2006.01)
*H01L 43/02* (2006.01)
*H01L 43/10* (2006.01)

(52) U.S. Cl.
CPC ............. *H01L 43/08* (2013.01); *H01L 43/02* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 5,498,298 A * | 3/1996 | Wecker | H01L 43/10 148/105 |
| 2010/0073827 A1 * | 3/2010 | Zhao | B82Y 10/00 360/324.2 |
| 2011/0303997 A1 * | 12/2011 | Wang | B82Y 25/00 257/421 |
| 2013/0001714 A1 * | 1/2013 | Nishiyama | G11C 11/16 257/421 |
| 2013/0114334 A1 * | 5/2013 | Yi | H01L 43/08 365/158 |
| 2013/0241015 A1 * | 9/2013 | Nomachi | H01L 43/08 257/421 |
| 2014/0021426 A1 | 1/2014 | Lee et al. | |
| 2014/0035073 A1 * | 2/2014 | Toko | H01L 43/02 257/421 |
| 2014/0131824 A1 * | 5/2014 | Kitagawa | G11C 11/161 257/425 |
| 2014/0203383 A1 * | 7/2014 | Guo | H01L 43/10 257/421 |
| 2014/0203385 A1 * | 7/2014 | Kobayashi | H01L 43/10 257/427 |
| 2014/0312441 A1 * | 10/2014 | Guo | H01L 43/04 257/427 |
| 2014/0339504 A1 * | 11/2014 | Kim | H01L 43/12 257/16 |
| 2015/0008547 A1 * | 1/2015 | Pi | H01L 43/04 257/421 |
| 2015/0061053 A1 * | 3/2015 | Nakayama | H01L 43/10 257/421 |
| 2015/0069553 A1 * | 3/2015 | Nagase | H01L 43/02 257/421 |
| 2015/0070128 A1 * | 3/2015 | Ueda | H01L 43/08 338/32 R |
| 2015/0295164 A1 * | 10/2015 | Sandhu | H01L 43/02 257/421 |

FOREIGN PATENT DOCUMENTS

JP 2012222093 A 11/2012

* cited by examiner

*Primary Examiner* — Evren Seven
(74) *Attorney, Agent, or Firm* — Holtz, Holtz & Volek PC (57) ABSTRACT

According to one embodiment, a magnetoresistive memory device includes a first magnetic layer, a second magnetic layer, a nonmagnetic layer provided between the first magnetic layer and the second magnetic layer, and a third magnetic layer provided on a side of the first or second magnetic layer opposite to the nonmagnetic layer. The third magnetic layer has a multilayer film having an artificial lattice structure, and the third magnetic layer is partly microcrystalline or amorphous.

18 Claims, 6 Drawing Sheets

MAGNETORESISTIVE MEMORY DEVICE

CROSS-REFERENCE TO RELATED APPLICATIONS

This application claims the benefit of U.S. Provisional Application No. 62/121,337, filed Feb. 26, 2015, the entire contents of which are incorporated herein by reference.

FIELD

Embodiments described herein relate generally to a magnetoresistive memory device.

BACKGROUND

Recently, large-capacity magnetoresistive random access memories (MRAM) using a magnetic tunnel junction (MTJ) element have been gaining attention and raising expectations. The MTJ element comprises the following two magnetic layers sandwiching a tunnel barrier layer: a magnetization fixed layer (reference layer) having a fixed direction of magnetization and a magnetization free layer (storage layer) having an easily reversible direction of magnetization. There is a case in which the MTJ element further comprises a shift-adjustment layer to prevent the influence of a stray magnetic field.

When the shift-adjustment layer of the MTJ element is made thick, variations in the in-plane grain size occur, which leads to variations in the perpendicular magnetic anisotropy of an element as formed. In the case of the shift-adjustment layer having a multilayer artificial lattice in particular, since the grains grow as the thickness of the layer increases, the variations become wider.

DETAILED DESCRIPTION

In general, according to one embodiment, a magnetoresistive memory device comprising: a first magnetic layer; a second magnetic layer; a nonmagnetic layer provided between the first magnetic layer and the second magnetic layer; and a third magnetic layer provided on a side of the first or second magnetic layer opposite to the nonmagnetic layer. The third magnetic layer is a multilayer film having an artificial lattice structure including a layer of microcrystallite of 10 nm or less or an amorphous layer.

Embodiments will be described hereinafter with reference to the accompanying drawings.

First Embodiment

Figure 1:
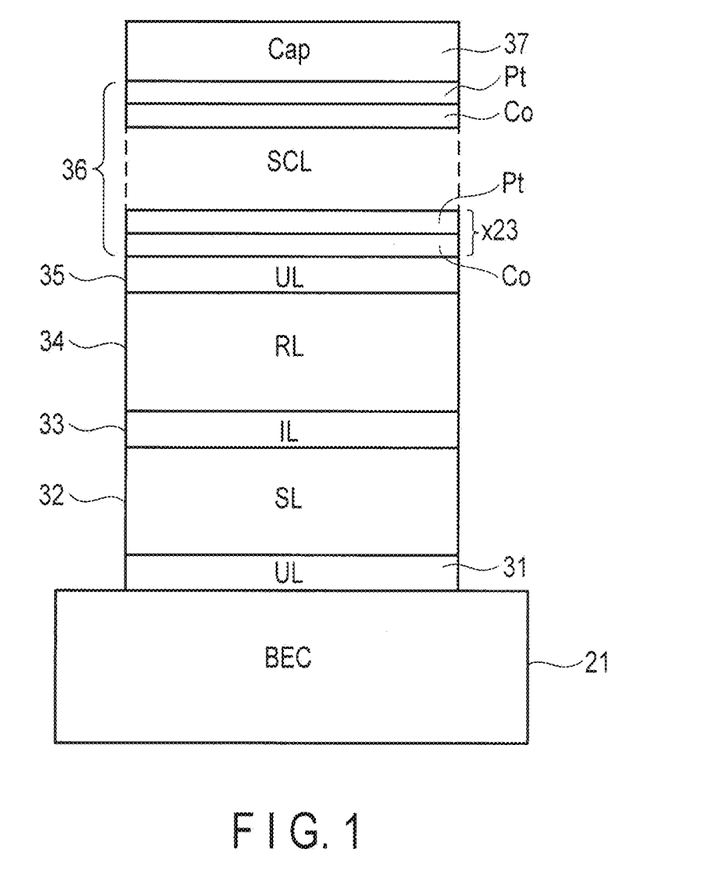
FIG. 1 is a cross-sectional diagram showing the general structure of a magnetoresistive memory device of a first embodiment.

FIG. 1 is a cross-sectional diagram showing the general structure of a magnetoresistive memory element of the first embodiment.

The component denoted by a reference number 21 in the drawing is a bottom electrode (BEC) of Ta or the like, and on the bottom electrode 21, a storage layer (SL [first magnetic layer]) 32 of CoFeB or the like is formed via an underlayer (UL) 31. On the storage layer 32, a tunnel barrier layer (IL [nonmagnetic layer]) 33 of MgO is formed, and on the tunnel barrier layer 33, a reference layer (RL [second magnetic layer]) 34 of CoFeB or the like is formed. That is, an MTJ element in which the nonmagnetic layer 33 is sandwiched between the magnetic layers 32 and 34 is formed.

Note that the storage layer 32 has magnetic anisotropy in a direction perpendicular to the film surface and has a variable direction of magnetization. The reference layer 34 has magnetic anisotropy in a direction perpendicular to the film surface and has a fixed direction of magnetization.

On the reference layer 34, a shift-adjustment layer (SCL [third magnetic layer]) 36 is formed via an underlayer 35. The shift-adjustment layer 36 has an artificial lattice of alternately laminated Co and Pt. Further, as will be described later, some Co of the shift-adjustment layer 36 is substituted by CoB.

On the shift-adjustment layer 36, a cap layer (cap) 37 of Ta, Ru or the like is formed. On the cap layer 37, a top electrode (not shown) is to be formed.

In the above-described structure, if the shift-adjustment layer 36 is formed only of the lamination of Co and Pt, variations in the in-plane grain size occur as the grains grow. The variations cause degradation in the flatness of the surface. Further the variation causes the perpendicular magnetic anisotropy variation of each bit when the element is finally formed.

In the present embodiment, some Co of the shift-adjustment layer 36 is substituted by CoB. By substituting Co by CoB, a microcrystalline layer is inserted into the shift-adjustment layer 36 and the grain growth is suppressed in this portion, and thus it is possible to reduce variations in the in-plane grain size. Here, it is desirable that the grain size of the microcrystallite be 10 nm or less.

Figure 2:
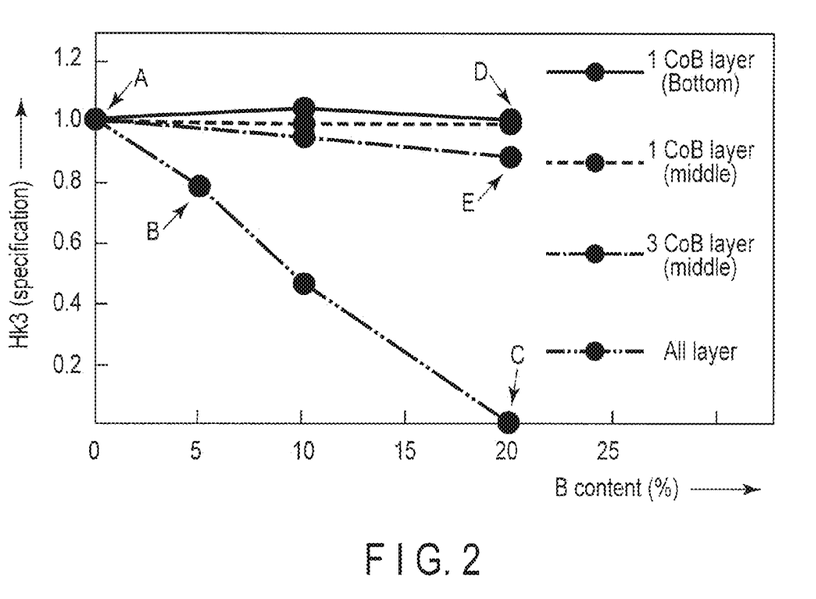
FIG. 2 is a characteristic diagram showing the dependence of a shift-adjustment layer on B content.

FIG. 2 is a diagram showing the dependence of the magnetic anisotropy of the CoB/Pt multilayer on B content. A single CoB layer may be formed in place of a Co layer or a plurality of CoB layers may be formed in place of Co layers. In FIG. 2, the solid line is of a case in which a single CoB layer is formed in place of the lowest Co layer, the broken line is of a case in which a single CoB is formed in place of a Co layer in the center (in the center in the laminating direction of Co and Pt), the one-dot chain line is of a case in which a plurality of CoB layers are formed in place of a plurality of Co layers in the center, and the two-dot chain line is of a case in which CoB layers are formed in place of all the Co layers.

As CoB layers are provided in place of Co layers, B is introduced into the shift-adjustment layer 36. As B content introduced into the shift-adjustment layer 36 increases, perpendicular magnetic anisotropy decrease. Therefore, the increase in B content is usually considered to be undesirable.

However, this produces an advantage of reducing variations in the grain size, which outweighs the disadvantage of reducing the perpendicular magnetic anisotropy.

FIGS. 3A to 3E are cross-sectional TEM images of the vicinity of the shift-adjustment layer. FIGS. 3A to 3E correspond to the cross sections at A to E of FIG. 2.

Figure 3A:
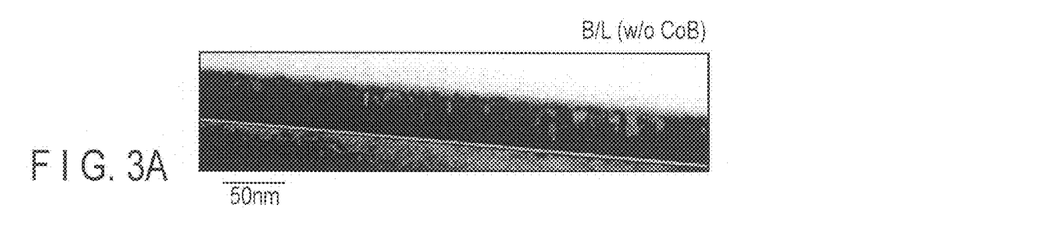
FIGS. 3A to 3E are cross-sectional TEM images at A to E of FIG. 2.
Figure 3B:
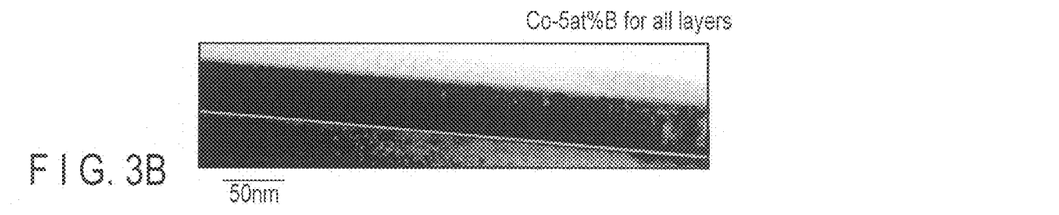
Figure 3C:
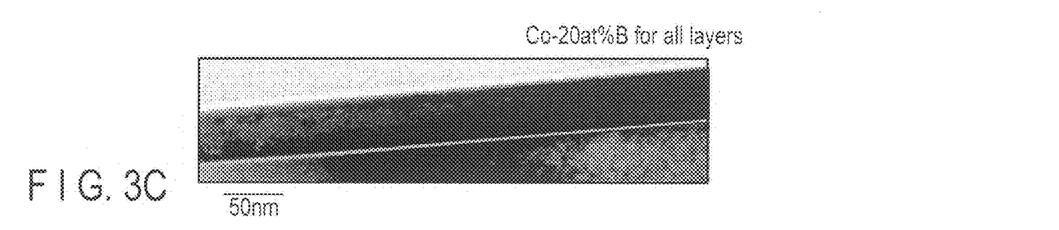
Figure 3D:
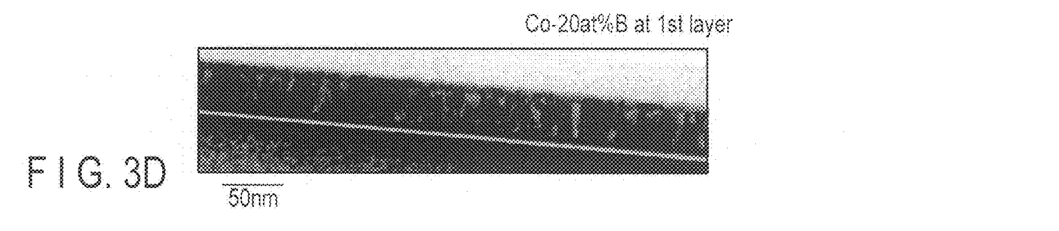
Figure 3E:
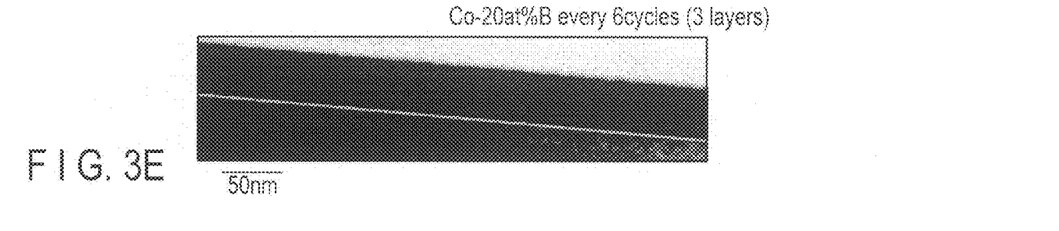

FIG. 3A is of a case in which there is no substitution by CoB, FIG. 3B is of a case in which all Co is substituted by CoB (Co-5 at % B), FIG. 3C is of a case in which all Co is substituted by CoB (Co-20 at % B), FIG. 3D is of a case in which Co of the lowest layer is substituted by CoB (Co-20 at % B), and FIG. 3E is of a case where Co of three layers in the center is substituted by CoB (Co-20 at % B).

As shown in FIGS. 3B and 3C, the surface of the shift-adjustment layer becomes flat when all Co is substituted by CoB. Further, as shown in FIGS. 3D and 3E, the surface of the shift-adjustment layer also becomes flat when some Co is substituted by CoB. These are because it is possible by inserting microcrystalline or amorphous CoB into the multilayer film to suppress the growth of the grains and to reduce variations in the grain size.

As described, according to the present embodiment, it is possible in the shift-adjustment layer 36 having an artificial lattice of the lamination of Co and Pt to suppress the grain growth of the shift-adjustment layer 36 by substituting some or all Co by CoB.

Consequently, it is possible to reduce variations in the in-plane grain size. Therefore, it becomes possible to improve the flatness of the surface of the shift-adjustment layer 36 and reduce variations in the perpendicular magnetic anisotropy of an element as formed from one bit to another.

Note that the substitution of the Co layer of the shift-adjustment layer 36 by CoB is to introduce B into the shift-adjustment layer 36. Instead of substituting Co by CoB, therefore, it is possible to substitute Pt by PtB.

Further, B is introduced into the shift-adjustment layer 36 to suppress the grain growth in the process of growing. What matters most in here is to form a microcrystalline or amorphous layer in the shift-adjustment layer 36, and therefore, the introduction of B is in no way restrictive.

Instead of introducing B, therefore, it is possible to grow the shift-adjustment layer 36 at a low temperature to make the shift-adjustment layer 36 partly amorphous. More specifically, the growth temperature in forming the artificial lattice of the shift-adjustment layer 36 is set to be in a range of −50° C. to −150° C. In order to set the growth temperature to be in the above-described range, for example, the stage may be cooled by using a cryopump. The shift-adjustment layer 36 formed in this way becomes partly microcrystalline or amorphous, and thus it is possible to reduce variations in the in-plane grain size.

Second Embodiment

Figure 4:
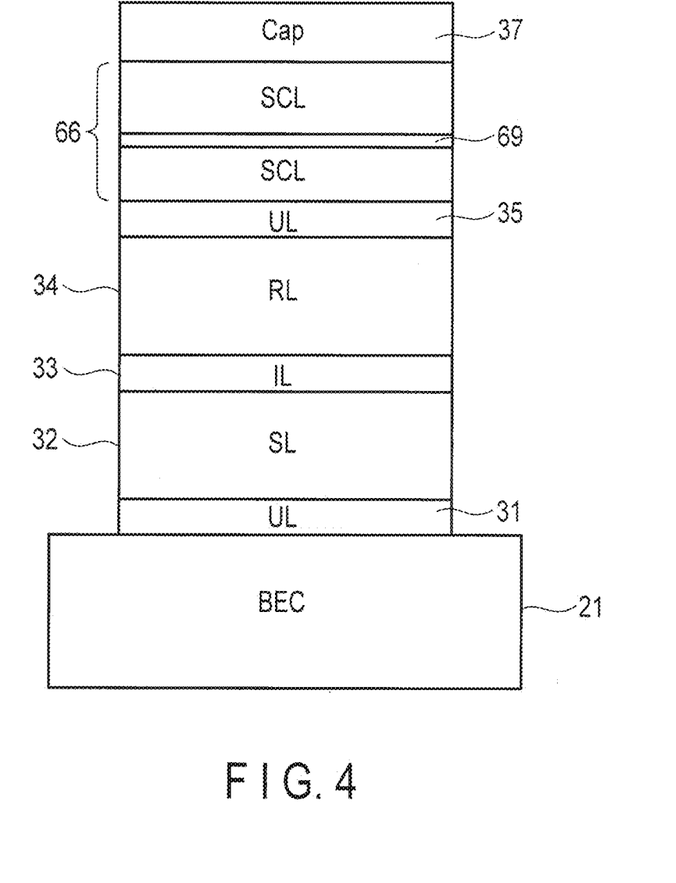
FIG. 4 is a cross-sectional diagram showing the general structure of a magnetoresistive memory device of a second embodiment.

FIG. 4 is a cross-sectional diagram showing the general structure of a magnetoresistive memory element of the second embodiment. Note that the components the same as those of FIG. 1 are denoted by the same reference numbers and symbols and the detailed descriptions thereof will be omitted.

The present embodiment is different from the previously-described embodiment in that a shift-adjustment layer 66 is not a multilayer film having an artificial lattice but a single CoNi layer. Further, the grain growth is suppressed by inserting a microcrystalline or amorphous CoB layer 69 into the shift-adjustment layer 66.

That is, on a bottom electrode 21, an underlayer 31, a storage layer 32, a tunnel barrier layer 33, a reference layer 34, and an underlayer 35 are formed in a manner similar to that of the first embodiment, and the shift-adjustment layer 66 of CoNi is formed thereon. The shift-adjustment layer 66 is formed continuously by sputtering to have a relatively large thickness.

When the CoNi layer is made relatively thick, since the grains grow as the thickness of the layer increases, variations in the grain size occur. In the present embodiment, the target is changed in the process of sputtering to form a significantly thin CoB layer 69, and then a CoNi layer again is formed thereon. Since the portion into which the CoB layer 69 is inserted becomes microcrystalline or amorphous, it is possible in the grain growth in the succeeding CoNi layer to reduce variations in the in-plane grain size.

It is possible in this structure as well to reduce variations in the in-plane grain size in the shift-adjustment layer 66, and thus an effect similar to that produced in the first embodiment can be achieved.

Third Embodiment

Figure 5:
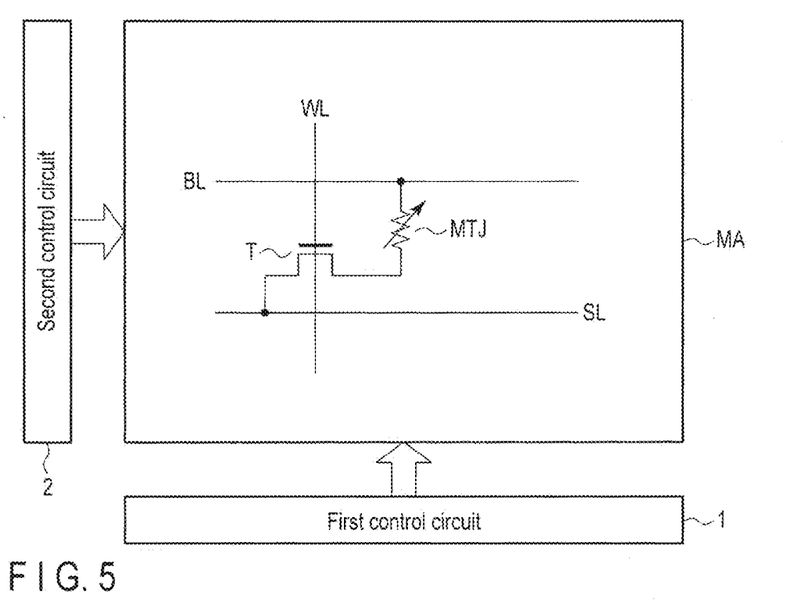
FIG. 5 is a diagram showing the circuit configuration of an MRAM memory cell array of a third embodiment.

FIG. 5 is a diagram showing the circuit configuration of a memory cell array of an MARM of the third embodiment.

The memory cell in a memory cell array MA comprises an MTJ element as a magnetoresistive memory element and a switch element (for example, a field-effect transistor [FET]) T connected with each other in series. One end of this series-connected entity (one end of the MTJ element) is electrically connected with a bit line BL, and the other end of the series-connected entity (one end of the switch element T) is electrically connected with a source line SL.

The control terminal of the switch element T, for example, the gate electrode of an FET is electrically connected to a word line WL. The potential of the word line WL is controlled by a first control circuit 1. Further, the potentials of the bit line BL and the source line SL are controlled by a second control circuit 2.

Figure 6:
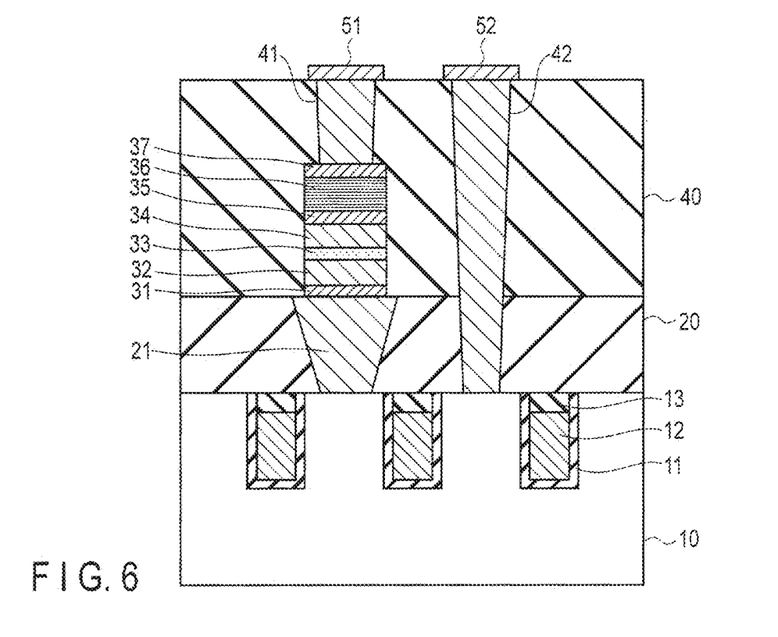
FIG. 6 is a cross-sectional diagram showing the structure of the MRAM memory cell of FIG. 5.

FIG. 6 is a cross-sectional diagram showing the structure of the memory cell of the MRAM of the third embodiment.

An MOS transistor for switching is formed on the surface of an Si substrate 10, and an interlayer insulating film 20 of $SiO_2$ or the like is formed thereon. The transistor has a buried gate structure in which a gate electrode 12 is formed in such a manner as to buried in a groove provided in the substrate 10 via a gate insulating film 11. The gate electrode 12 is formed in such a manner as to fill the groove halfway, and a protective film 13 of SiN or the like is then formed thereon. Further, although not shown in the drawing, p-type and n-type impurities are scattered respectively on the sides of the buried gate structure to form a source and drain region.

Note that the structure of the transistor is not necessarily limited to the buried gate structure. For example, it is possible to form a gate electrode on the surface of the Si substrate 10 via a gate insulating film. It suffices that the transistor is configured to function as a switch element.

The interlayer insulating film 20 is provided with a contact hole to connect with the grain of the transistor, and the bottom electrode (BEC) 21 is formed in such a manner as to be buried in the contact hole. The bottom electrode 21 is, for example, Ta.

On a part of the bottom electrode 21, underlayer 31 of Hf is formed. Underlayer 31 is provided to improve crystallinity of a layer formed thereon.

On underlayer 31, the storage layer (first magnetic layer [SL]) 32 of CoFeB as a ferromagnetic magnetization free layer, the tunnel barrier layer (intermediate layer [IL]) 33 of MgO, the reference layer (second magnetic layer [RL]) 34 of CoFeB as a ferromagnetic magnetization fixed layer, underlayer 35 of Ru or the like, the shift-adjustment layer 36 of CoPt or the like, and the cap layer 37 of Ta, Ru or the like are formed. That is, an MTJ element 30 in which the tunnel barrier layer 33 is sandwiched between the two ferromagnetic layers 32 and 34 is provided, and on the upper side of the MTJ element 30, the shift-adjustment layer 36 is formed. Note that underlayers 31 and 35 are provided to encourage crystallization of layers formed thereon and may be omitted.

It is desirable that the storage layer 32 be formed of a material having magnetocrystalline anisotropy (such as CoPd) or a material having magnetic interface anisotropy such as CoFeB (CFB)/oxide. The same applies to the reference layer 34.

On the substrate provided with the MTJ element 30, an interlayer insulating film 40 of $SiO_2$ or the like is formed. In the interlayer insulating film 40, a contact plug (TEC) 41 is buried to connect with the cap layer 37 formed on the MTJ element 30. Further, a contact plug 42 is buried in the interlayer insulating film 40 and the interlayer insulating film 20 to penetrate therethrough and connect with the source of the transistor. On the interlayer insulating film 40, an interconnect (BL) 51 which connects with the contact plug 41, and an interconnect (SL) 52 which connects with the contact plug 42 are formed.

Next, a method of manufacturing the memory cell of FIG. 6 will be described with reference to FIGS. 7A to 7C. Note that, here, the drawings show a portion of the memory cell from the bottom electrode 21 to the cap layer 38 for the sake of convenience.

Figure 7A:
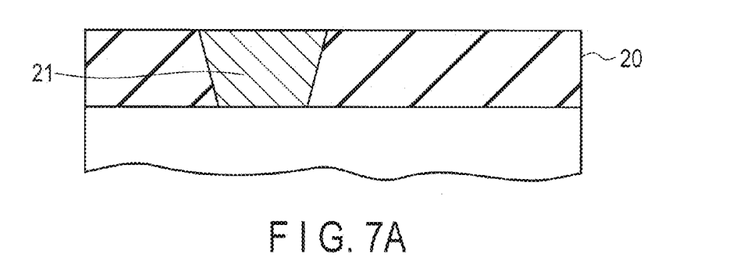
FIGS. 7A to 7C are cross-sectional diagrams showing the manufacturing processes of the memory cell of FIG. 6.

First, as shown in FIG. 7A, the MOS transistor (not shown) having a buried gate structure and used for switching is formed on the surface of the Si substrate 10, and then the interlayer insulating film 20 of $SiO_2$ or the like is accumulated on the Si substrate 10 by the CVD method. The contact hole is then formed in the interlayer insulating film 20 to connect with the drain of the transistor, and the bottom electrode 21 of crystalline Ta is formed in such a manner as to be buried in the contact hole. More specifically, a Ta film is accumulated on the interlayer insulating film 20 by a sputtering method or the like in such a manner as to fill the contact hole, and the Ta film is then removed from the interlayer insulating film by chemical mechanical etching (CMP) in such a manner as to leave the Ta film only in the contact hole.

Figure 7B:
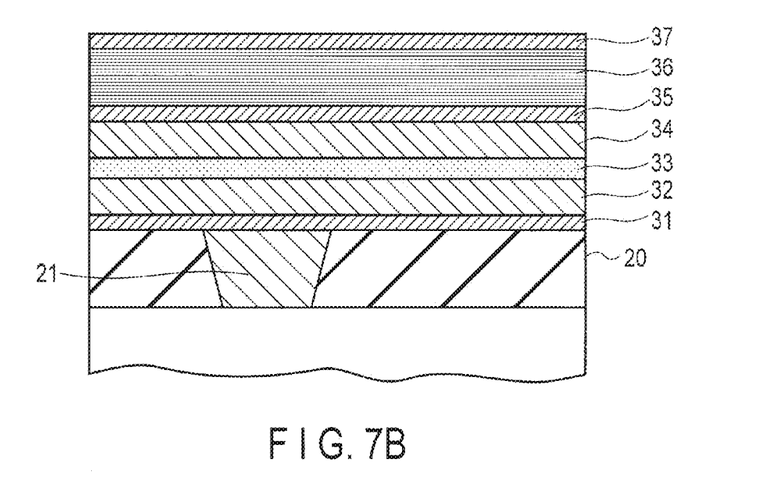
Figure 7C:
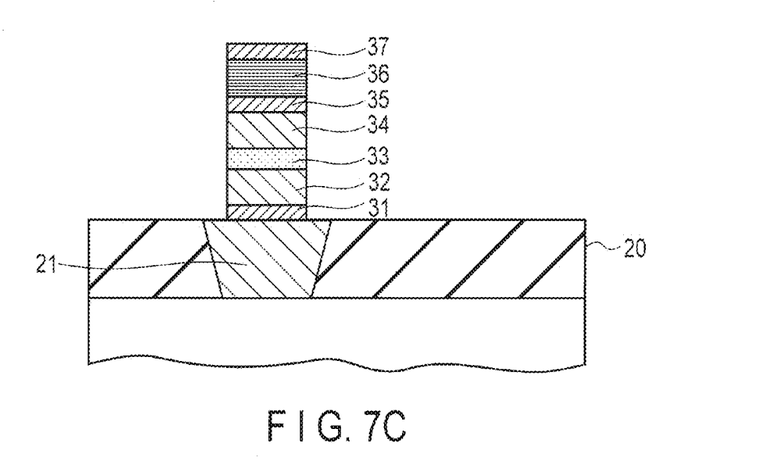

Next, as shown in FIG. 7B, on the bottom electrode and the interlayer insulating film 20, the storage layer 32 is formed via underlayer 31. That is, after underlayer 31 of Hf or the like is formed on the bottom electrode 21 and the interlayer insulating film 20, the magnetic layer 32 of CoFeB or the like is formed by a sputtering method. Subsequently, the tunnel barrier layer 33 of MgO is formed on the magnetic layer 32. The magnetic layer 34 of CoFeB or the like is then formed on the tunnel barrier layer 33, and further underlayer 35, the shift-adjustment layer 36 and the cap layer 37 are formed thereon. The shift-adjustment layer 36 is formed in a manner similar to that of the first embodiment.

After a hard mask (not shown) is formed on the cap layer 37, selective etching is performed from the cap layer 37 to underlayer 31 in an element pattern by ion beam etching (IBE) using, for example, Ar to reach the bottom electrode 21.

Subsequently, the interlayer insulating film 40, the contact plugs 41 and 42, and the interconnects 51 and 52 are formed in this order, and the structure of FIG. 6 is then obtained.

As described, it is possible to reduce variations in the grain size in the shift-adjustment layer 36, and therefore it is possible in the present embodiment as well to reduce variations in the in-plane grain size in the shift-adjustment layer 36. Consequently, an effect similar to that produced in the first embodiment can be achieved.

MODIFIED EXAMPLE

Note that the present invention is not necessarily limited to each of the above-described embodiments.

The shift-adjustment layer is not necessarily limited to the lamination of Co and Pt and may be the lamination of various metals. For example, the shift-adjustment layer may be the lamination of Fe and Pt, the lamination of Co and Pd, or the lamination of Co and Ni. Further, the shift-adjustment layer is not necessarily formed on the upper side of the reference layer and may be formed on the lower side of the storage layer. Still further, it is also possible to form shift-adjustment layers respectively on the upper side of the reference layer and on the lower side of the storage layer.

Further, it is also possible to reverse the positional relationship between the storage layer and the reference layer which constitute the MTJ element. That is, with respect to the barrier layer, the reference layer may be formed on the substrate side and the storage layer may be formed on the side opposite to the substrate.

Still further, as the tunnel barrier layer, not only MgO but also oxides including Si, Ba, Ca, La, Mn, Zn, Hf, Ta, Ti, B, Cu, Cr, V, or Al may be used. In the case of manufacturing a perpendicular magnetic memory in particular, it is desirable that such a material as to induce perpendicular magnetic anisotropy at the interface with a magnetic layer be used.

Still further, although the reference layer is assumed to be a single-layer film in the embodiments, the reference layer may be a multilayer film having an artificial lattice similar to that of the shift-adjustment layer of the first embodiment. In this case, it becomes possible to reduce variations in the grain size in the reference layer by inserting a microcrystalline or amorphous layer into the multilayer film in a manner similar to that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetoresistive memory device comprising:
   a first magnetic layer having a variable magnetization direction;
   a second magnetic layer having a first fixed magnetization direction;
   a nonmagnetic layer provided between the first magnetic layer and the second magnetic layer; and
   a third magnetic layer provided on a surface of the first or second magnetic layer opposite to the nonmagnetic layer, the third magnetic layer having a second fixed magnetization direction opposite to the first fixed magnetization direction,
wherein the third magnetic layer is a multilayer film and is partly microcrystalline or amorphous.

2. The device of claim 1, wherein the third magnetic layer is provided on a surface of the second magnetic layer opposite to the nonmagnetic layer.

3. The device of claim 1, wherein the third magnetic layer includes a microcrystalline or amorphous layer in the multilayer film.

4. The device of claim 3, wherein the third magnetic layer has a laminated structure with alternating a first metal and a second metal, and a third metal is added to at least one layer of the first metal or the second metal.

5. The device of claim 1, wherein the third magnetic layer has a laminated structure with alternating Co or CoB and Pt and includes at least one CoB layer.

6. The device of claim 5, wherein the third magnetic layer contains CoB in a portion close to the nonmagnetic layer.

7. The device of claim 5, wherein the third magnetic layer contains CoB in a central part in a thickness direction.

8. The device of claim 5, wherein the third magnetic layer contains CoB in certain intervals in a thickness direction.

9. The device of claim 1, wherein the third magnetic layer has a laminated structure with alternating CoB and Pt.

10. A magnetoresistive memory device comprising:
a first magnetic layer having a variable magnetization direction;
a second magnetic layer having a first fixed magnetization direction;
a nonmagnetic layer provided between the first magnetic layer and the second magnetic layer; and
a third magnetic layer provided on a surface of the first or second magnetic layer opposite to the nonmagnetic layer, the third magnetic layer having a second fixed magnetization direction opposite to the first fixed magnetization direction, and the third magnetic layer being partly microcrystalline or amorphous.

11. The device of claim 10, wherein the third magnetic layer is provided on a surface of the second magnetic layer opposite to the nonmagnetic layer.

12. The device of claim 10, wherein the third magnetic layer includes a microcrystalline or amorphous layer inserted therein.

13. The device of claim 10, wherein the third magnetic layer is a CoNi layer including a CoB layer inserted therein.

14. A magnetoresistive memory device comprising:
a first magnetic layer having a variable magnetization direction;
a second magnetic layer having a first fixed magnetization direction;
a nonmagnetic layer provided between the first magnetic layer and the second magnetic layer; and
a third magnetic layer provided on a surface of the first or second magnetic layer opposite to the nonmagnetic layer, the third magnetic layer having a second fixed magnetization direction opposite to the first fixed magnetization direction,
wherein the third magnetic layer is a multilayer film with alternating Co and Pt, and includes B.

15. The device of claim 14, wherein the third magnetic layer is provided on a surface of the second magnetic layer opposite to the nonmagnetic layer.

16. The device of claim 14, wherein the third magnetic layer includes a microcrystalline or amorphous layer in the multilayer film.

17. The device of claim 14, wherein the third magnetic layer contains CoB in certain intervals in a thickness direction.

18. The device of claim 14, wherein the third magnetic layer has a laminated structure with alternating CoB and Pt.

* * * * *